(12) United States Patent
Gueneau de Mussy et al.

(10) Patent No.: US 7,037,851 B2
(45) Date of Patent: May 2, 2006

(54) METHODS FOR SELECTIVE INTEGRATION OF AIRGAPS AND DEVICES MADE BY SUCH METHODS

(75) Inventors: Jean Paul Gueneau de Mussy, Elsene (BE); Gerald Beyer, Leuven (BE); Karen Maex, Herent (BE)

(73) Assignee: Interuniversitair Microelektronica Centrum (IMEC vzw), Leuven (BE)

( * ) Notice: Subject to any disclaimer, the term of this patent is extended or adjusted under 35 U.S.C. 154(b) by 0 days.

(21) Appl. No.: 10/957,513

(22) Filed: Sep. 30, 2004

(65) Prior Publication Data

US 2005/0074960 A1    Apr. 7, 2005

Related U.S. Application Data

(60) Provisional application No. 60/507,584, filed on Sep. 30, 2003.

(30) Foreign Application Priority Data

Sep. 30, 2003    (EP) .................................. 03447239

(51) Int. Cl.
*H01L 21/302* (2006.01)
(52) U.S. Cl. .................. 438/739; 438/690; 438/691; 438/705; 438/725; 438/624; 438/639; 438/638; 438/421; 438/422
(58) Field of Classification Search ............. 438/619, 438/735, 739, 624, 690, 691, 705, 725, 421, 438/422, 638, 639; 216/72
See application file for complete search history.

(56) References Cited

U.S. PATENT DOCUMENTS

| | | | |
|---|---|---|---|
| 6,255,156 B1 | 7/2001 | Forbes et al. | 438/235 |
| 6,268,261 B1 | 7/2001 | Petrarca et al. | 438/421 |
| 6,342,722 B1 | 1/2002 | Armacost et al. | 257/522 |
| 6,387,818 B1 | 5/2002 | Lopatin | 438/723 |
| 6,492,245 B1 | 12/2002 | Liu et al. | 438/422 |
| 6,589,861 B1 * | 7/2003 | Park et al. | 438/619 |
| 6,599,814 B1 | 7/2003 | Vanhaelemeersch et al. | 438/431 |
| 2002/0055243 A1 | 5/2002 | Lee | 438/586 |
| 2002/0127844 A1 | 9/2002 | Grill et al. | 438/622 |

OTHER PUBLICATIONS

European Search Report for EP 04 44 7219.9, application of Interuniversitair Micro-Elektronica Centrum, dated Feb. 9, 2005. Includes Abstract.
European Search Report for EP 04 44 7220.7, application of Interuniversitair Micro-Elektronica Centrum, dated Feb. 9, 2005. Includes Abstract.

* cited by examiner

*Primary Examiner*—George Fourson
*Assistant Examiner*—Julio J. Maldonado
(74) *Attorney, Agent, or Firm*—McDonnel Boehnen Hulbert & Berghoff LLP

(57) ABSTRACT

Method for the production of airgaps in a semiconductor device, the semiconductor device comprising a stack of layers, the stack of layers comprising at least one iteration of a sub-stack of layers.

23 Claims, 18 Drawing Sheets

Air cavities

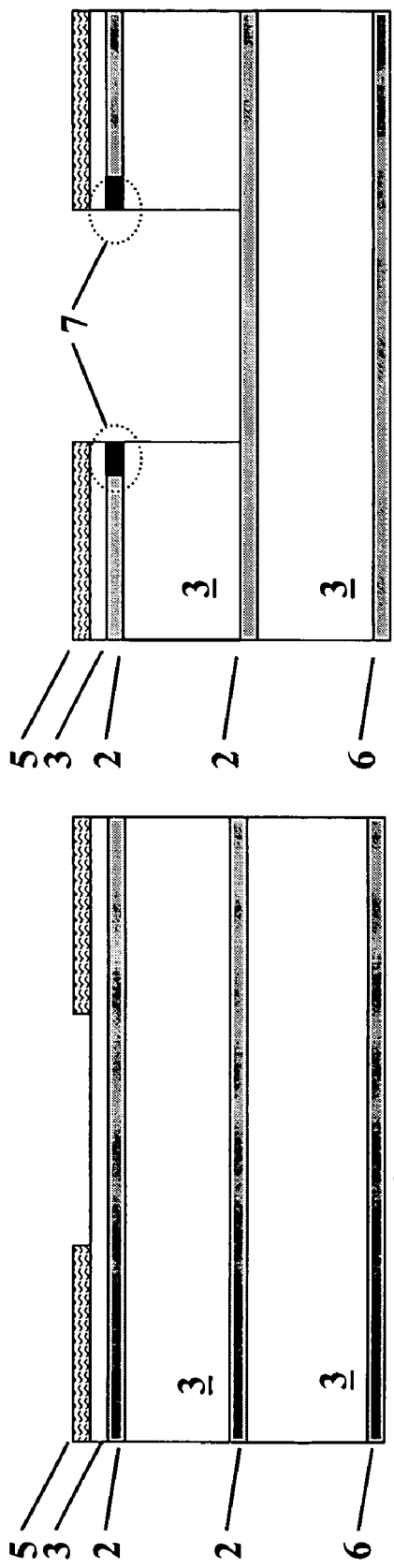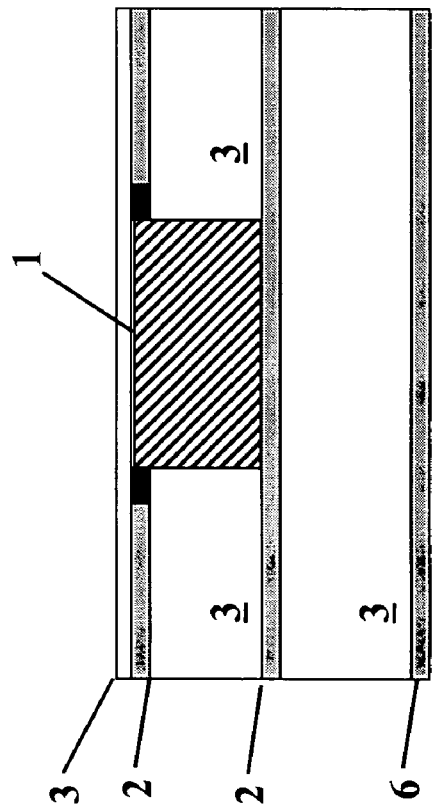

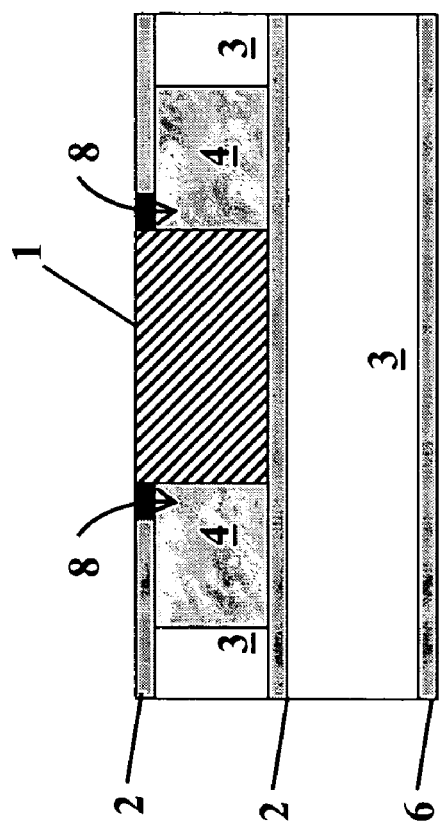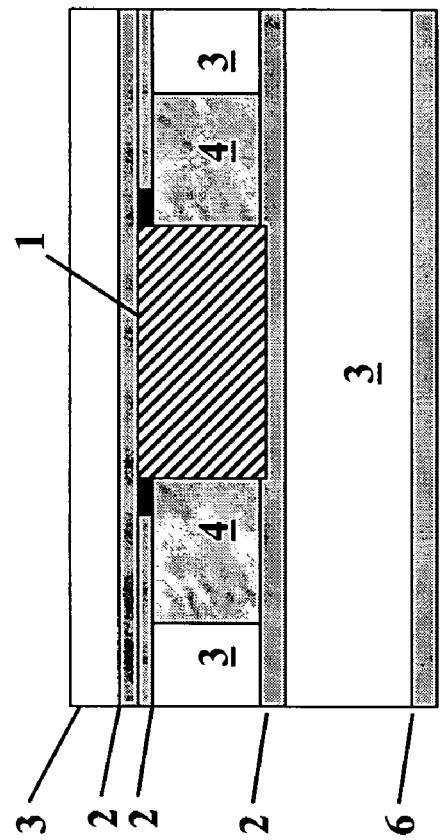

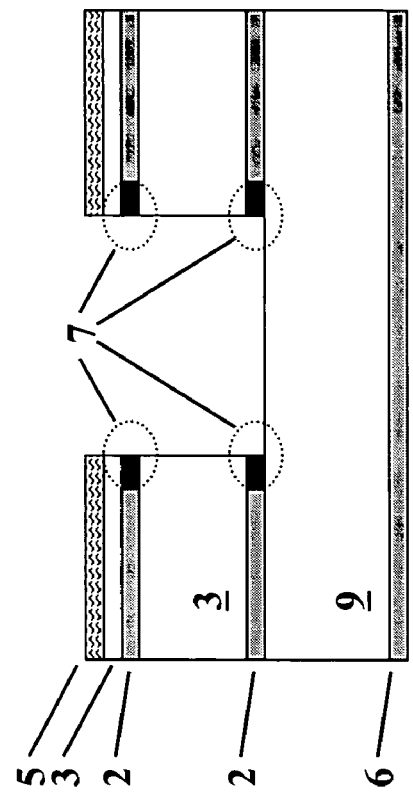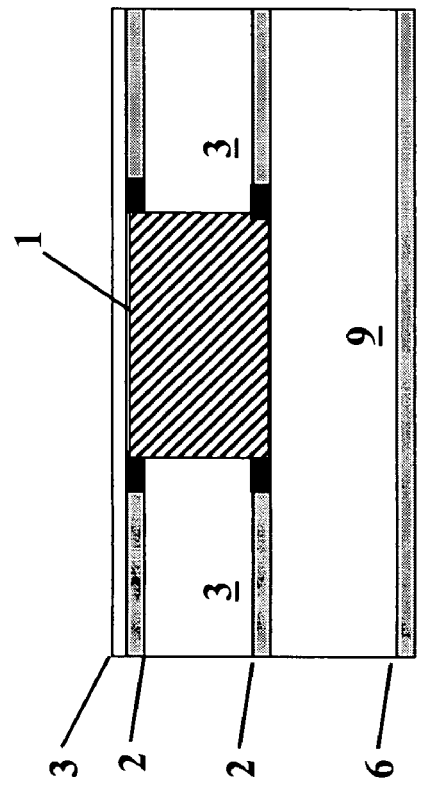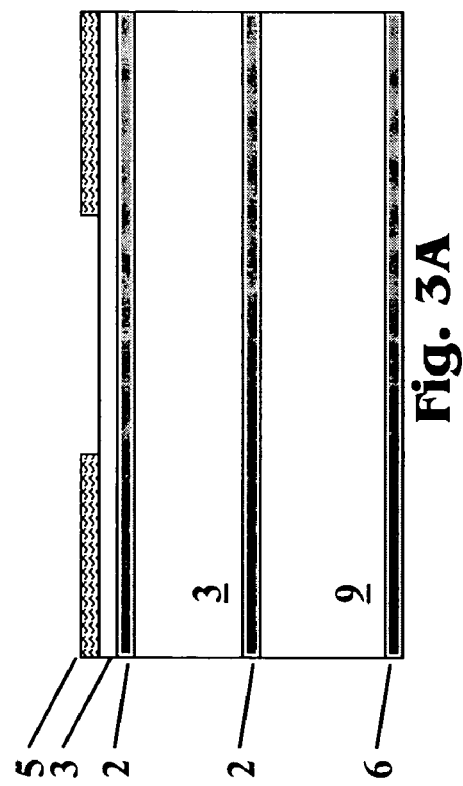

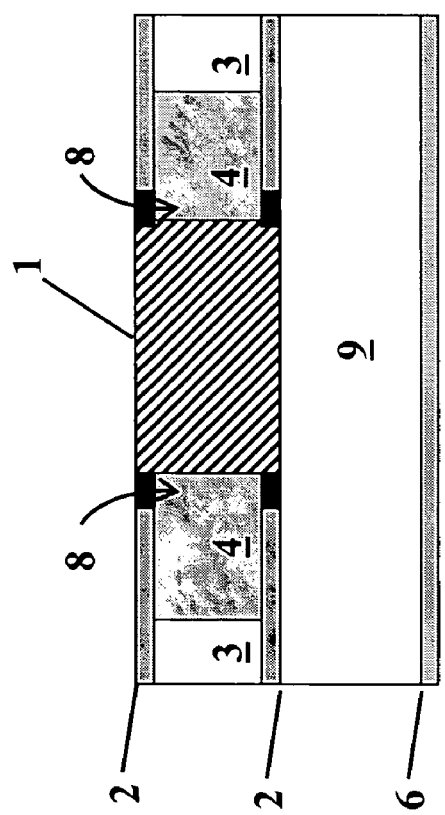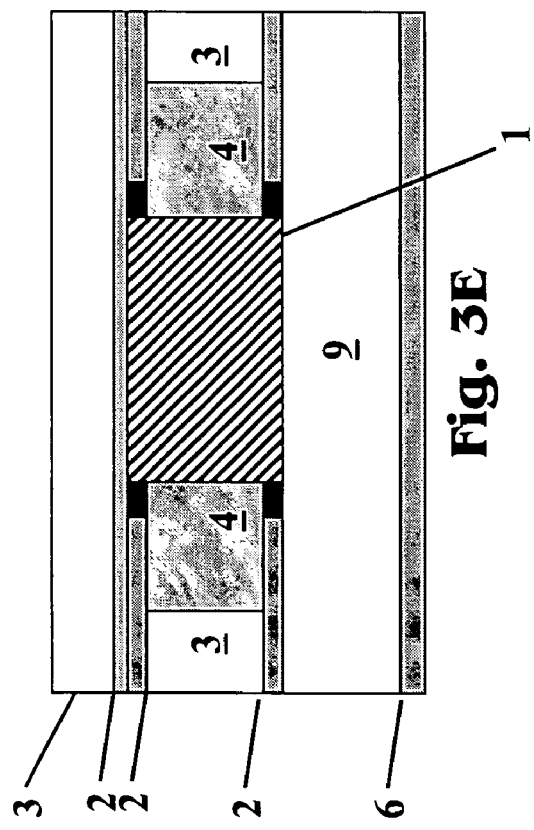

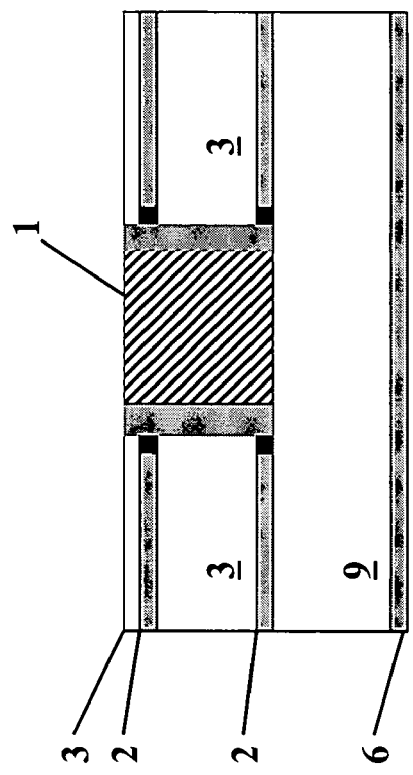
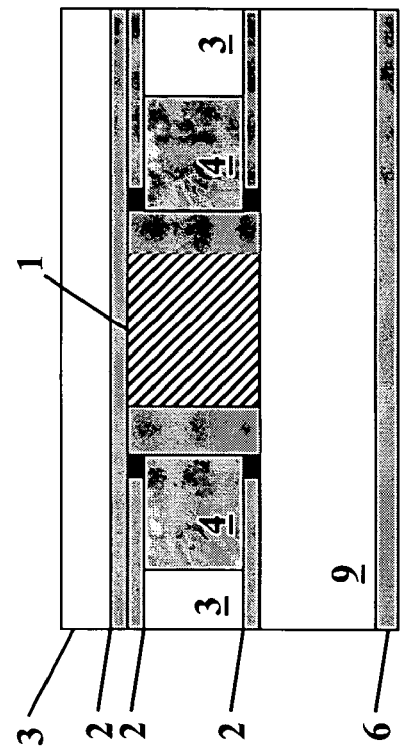
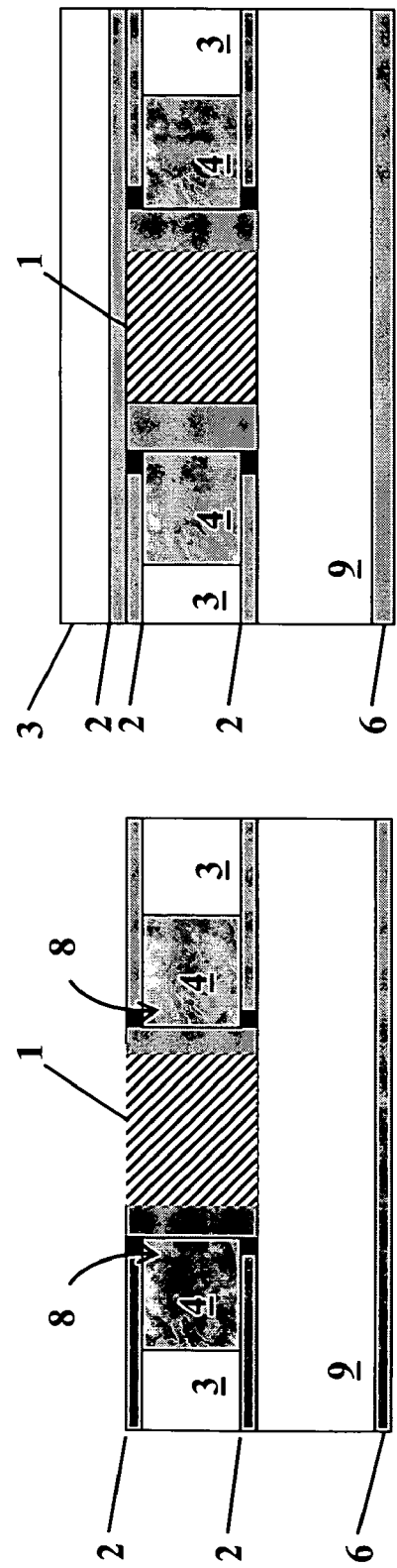

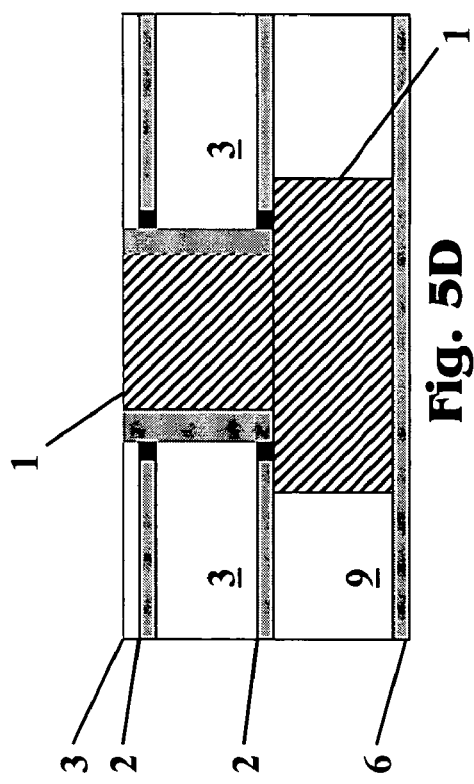
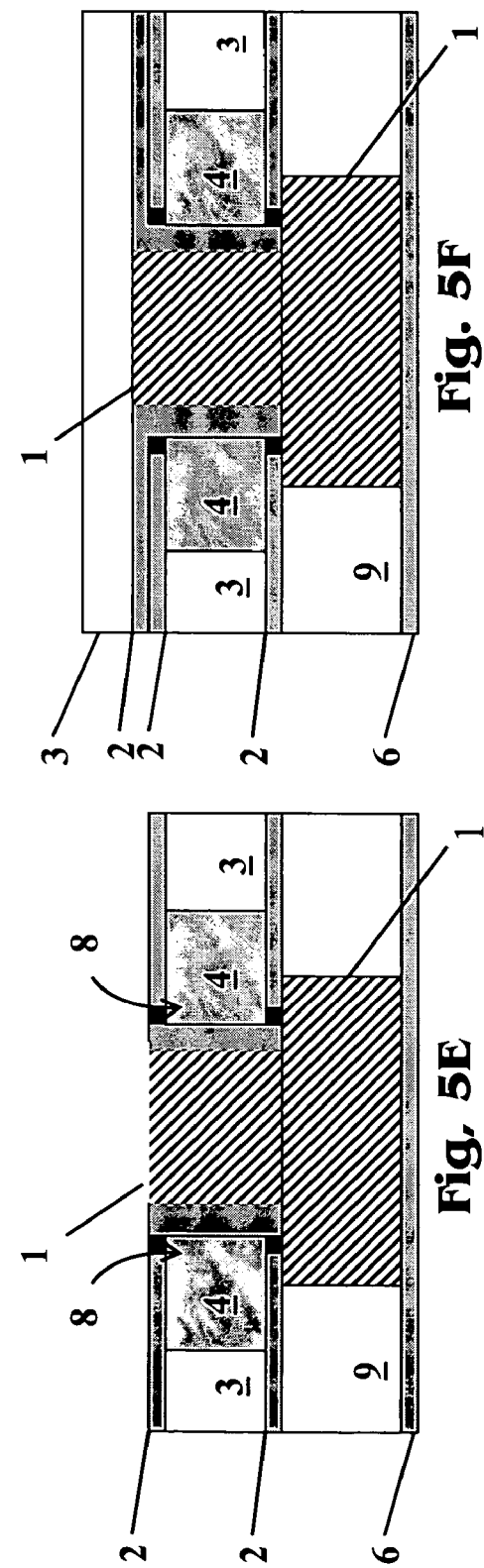

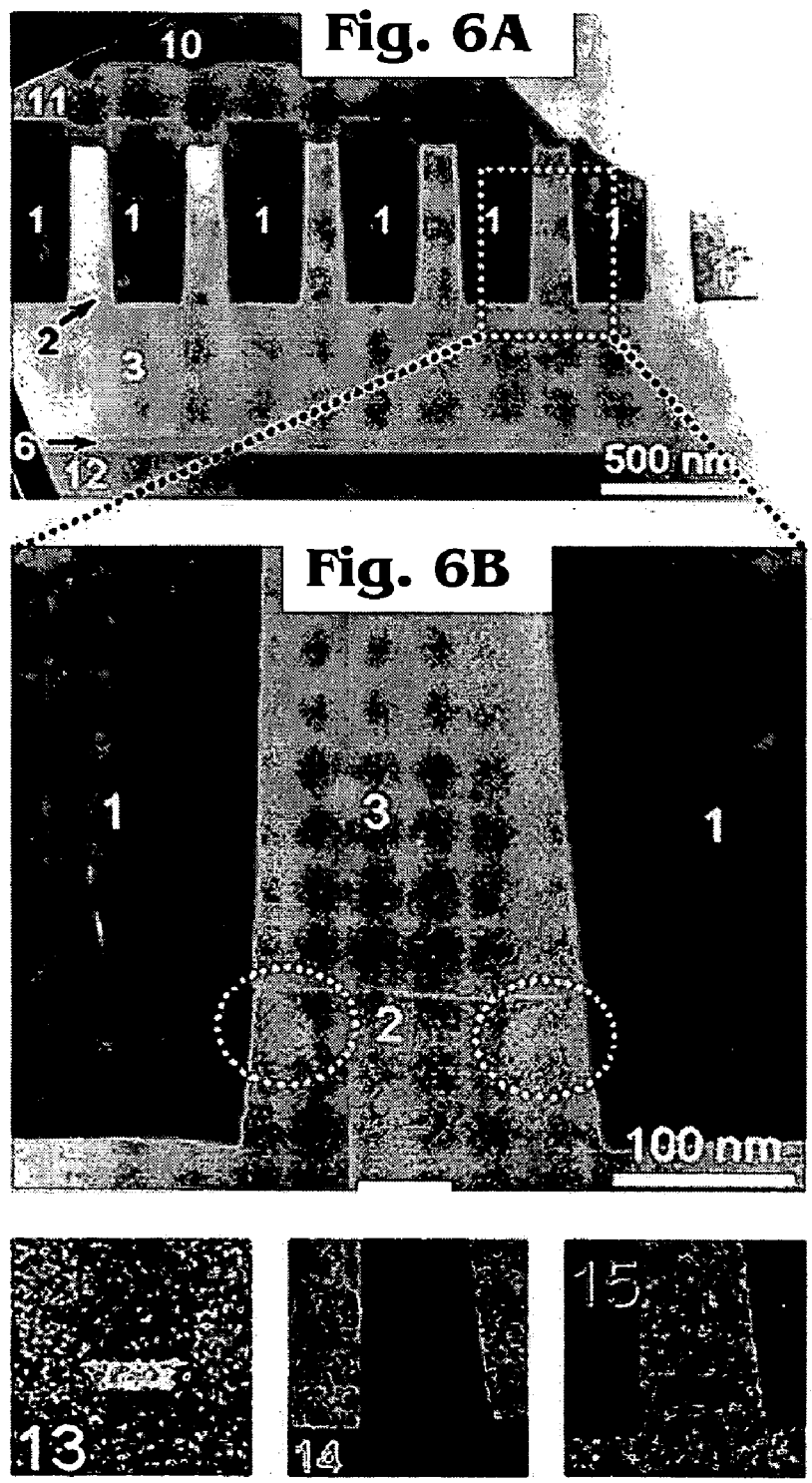

Resist
SiC
SiO₂
SiC
SiO₂

Selectively oxidized SiC sites

Cu
Ta/Ta(N), Cu seed

Air cavities

METHODS FOR SELECTIVE INTEGRATION OF AIRGAPS AND DEVICES MADE BY SUCH METHODS

CROSS REFERENCE TO RELATED APPLICATIONS

This application claims benefit, under 35 U.S.C. § 119(e), of U.S. Provisional Patent Application 60/507,584, which was filed on Sep. 30, 2003. This application also claims priority to European Patent Application EP 03447239.9, filed on Sep. 30, 2003. The entire disclosures of U.S. Provisional Application 60/507,584 and European Application EP 03447239.9 are incorporated herein by reference.

FIELD

This invention is related to the field of semiconductor processing and, more specifically, to the production of micro and nano-electromechanical systems (MEMS, NEMS) and low dielectric constant isolation for interconnects.

BACKGROUND

Airgaps are currently employed in semiconductor devices, such as integrated circuit (IC) devices as both structural or functional (e.g., circuit) element. Also, airgaps in the form of cavities may be present in MEMS and NEMS devices. The use of airgaps is considered to be very promising in the technology area of circuit interconnects, where airgaps may be used as a dielectric for isolation of such interconnects. As the geometries of IC technologies scale down, interconnects are becoming one of the major limiting factors of improved signal propagation delay times, reduced dynamic power consumption and reduction of signal errors resulting from cross-talk effects between adjacent metal lines. Some improvement has been realized by the semiconductor industry's transition from the use of aluminum to the use copper as an interconnect material. This has change has resulted in a reduction in the resistance of IC interconnects, and thus improvements in propagation delays and reductions in dynamic power consumption.

A current focus in the semiconductor industry is to achieve better isolation between the interconnect lines through the introduction of materials with lower dielectric constant than that of silicon oxide (k=4.2) in order to reduce the capacitance (C) between lines. However, the integration of low-k materials (k<3.0) into IC production processes creates a number of challenges associated with leakage, mechanical instability and joule heating, increasing the overall cost of future IC processes. Additionally, the barrier and intermediate layers that employed in such processes tend to increase the effective permittivity of the final stack, which is undesirable from a circuit performance standpoint.

The dielectric and electrical insulation properties of air makes the integration of airgaps as isolation between metal interconnect lines in IC device desirable in order to address some of the concerns discussed above. In fact, the approach of using of air as a dielectric to isolate electrical interconnects has been employed to reduce resistive-capacitive (RC) delay, as well as to reduce dynamic power consumption and signal errors (e.g. due to cross-talk between adjacent metal lines).

One approach that has been used to introduce air cavities into IC devices involves isotropic etching of a device. Such a process has been employed in the production of MEMS devices. This approach includes using hydrofluoric acid (HF) to dissolve a sacrificial SiO2 layer. In such a technique, a film that is relatively non-reactive with HF (e.g., SiC) is employed as an etch stop. The etch source is then sealed by a non-conformal CVD SiO2 layer.

Another approach for the introduction of air cavities is the use anisotropic etching. This approach includes eliminating material using an anisotropic dry etch. A mask is then used as part of the dry etch and strip operations. Subsequently, a conformal CVD SiO2 film, followed by a non-conformal CVD SiO2 film, is deposited on top of the lines to be used for the creation of airgaps.

U.S. Pat. No. 6,268,261 describes a process for manufacturing a semiconductor circuit that includes the use of airgaps. This process includes creating a plurality of adjacent conductive lines with a solid fill material between the conductive lines. One or more layers are formed above the lines and the fill material and one or more pathways to the fill material are formed through the layers formed above the lines and the fill material. The fill material is then converted to a gas that escapes through the pathways. This process leaves air voids between adjacent lines. The process results in a multi-layer semiconductor circuit with conductive lines, where the lines have airgaps (or voids) as a dielectric between them. This process has certain drawbacks, however. For example, the solid fill material needs to be deposited between the conductive lines. This fill material must be stable during deposition of the layers on top and be of a composition that is easily convertible to a gas. Further, in designing such circuits, the layers on top of a pathway need to be accounted for. Therefore, such an approach involves research and development of fill material compositions, circuit design considerations, and additional manufacturing operations, such as extra masking and etching steps.

SUMMARY

Methods for the integration of airgaps in a semiconductor device and devices produced by such methods are disclosed. One embodiment of such a semiconductor device includes a stack of layers, where the stack of layers has at least one sub-stack of layers. The sub-stack of layers includes a liner layer formed from a liner material and a sacrificial layer formed from a sacrificial layer material. The liner material is resistant to a first etching substance, while the first etching substance is able to etch the sacrificial layer material. In certain embodiments, the sacrificial layer takes the form of a dielectric layer, which is situated under the liner layer.

The liner layer material is situated on top of and under the sacrificial layer (e.g., as multiple liner layers). The liner layer material that is formed on top of the sacrificial layer acts as a hardmask layer. The liner layer material that is situated under the sacrificial layer may act as etch stop layer.

A method for the production of airgaps includes plasma dry etching a hole in the stack of layers with a second etching substance such that a hole or trench (hereafter "hole") is formed and also chemically and/or mechanically changes the properties of the liner layer locally, such that part of the liner layer is converted locally and becomes etchable by the first etching substance. The method further includes creating a line formed of conductive material in the hole. The line of conductive material may be separated from the sacrificial layer by a barrier layer. The line of conductive material or, if present, the barrier layer, is resistant to the first etching substance. The method also includes applying the first etching substance to the stack of layers, such that airgaps are created around the line.

In certain embodiments a liner layer situated on top of a sacrificial layer is locally converted by the second etching substance, and etching of the hole is stopped by a liner layer situated under said sacrificial layer. In such an approach, the liner layer situated under the sacrificial layer is said to act as an etch stop layer. In other embodiments, both the liner layer on top of the sacrificial layer (acting as hardmask layer) and the liner layer under the sacrificial layer are locally converted by the second etching substance.

The creation of the line of conductive material in the hole may be accomplished using any number of techniques. For example, the line may be formed by depositing a barrier layer and then depositing a layer of electrically conductive material on top of the barrier layer. Overburden of the conductive material and the barrier layer material are removed by applying a subtractive technique on top of the stack of layers such that at least one embedded line is created. Any number of subtractive techniques may be employed. These techniques include, but are not limited to Chemical Mechanical polishing (CMP), Electro Polishing, etch techniques or any combination of these or other techniques.

BRIEF DESCRIPTION OF THE DRAWINGS

Various embodiments are described herein with reference to the following drawings. Certain aspects of the drawings are depicted in a simplified way for reason of clarity. Not all alternatives and options are shown in the drawings and, therefore, the invention is not limited in scope to the content of the drawings. Like numerals are employed to reference like parts in the different figures, in which:

FIGS. 2A–2E are cross-sectional drawings illustrating a first manufacturing process for producing a first semiconductor device that employs airgaps as dielectric isolation;

FIGS. 3A–3E are cross-sectional drawings illustrating a second manufacturing process for producing a second semiconductor device that employs airgaps as dielectric isolation;

FIGS. 4A–4F are cross-sectional drawings illustrating a third manufacturing process for producing a third semiconductor device that employs airgaps as dielectric isolation;

FIGS. 5A–5F are cross-sectional drawings illustrating a fourth manufacturing process for producing a fourth semiconductor device that employs airgaps as dielectric isolation;

FIGS. 6A–6C are cross-sectional images of a Cu/$SiO_2$ single damascene (SD) stack at low (FIG. 6A) magnification and at high (FIG. 6B) magnification, FIG. 6C is EFTEM images showing the area surrounded by the white dotted square in FIG. 6A;

FIGS. 7A and 7C illustrate SD structure after 4 minutes and FIGS. 7B and 7D illustrate the structure after 8 minutes of VHF etch, FIGS. 7A and &B illustrate a narrow line (low area) and FIGS. 7C and 7D illustrate a bondpad (large area);

DETAILED DESCRIPTION

Figure 1A:
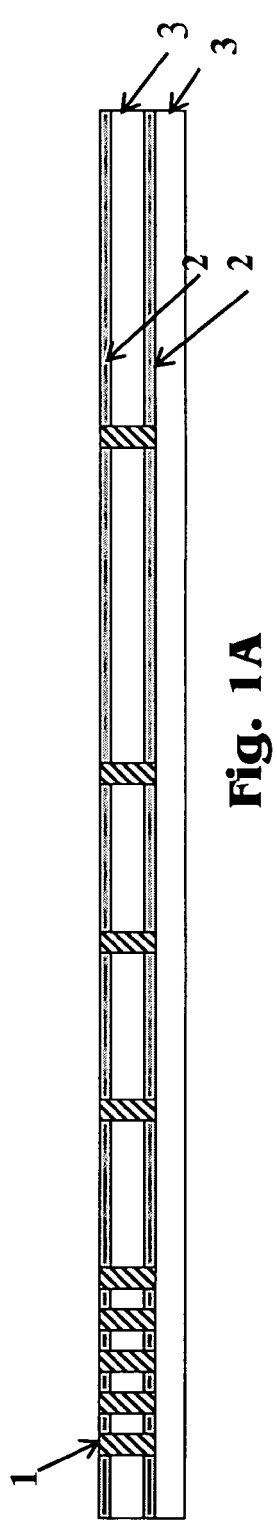
FIGS. 1A and 1B are cross-sectional drawings illustrating a single damascene (SD) stack before (FIG. 1A) and after (FIG. 1B) etch of a sacrificial layer material between narrowly spaced interconnects.

The following description illustrates various embodiments of methods for producing semiconductor devices using airgaps for isolation and embodiments of devices produced by such methods. It will be appreciated that there are numerous variations and modifications of these embodiments that are possible. Accordingly, the description of the various embodiments should not be deemed to limit the scope of the invention, which is defined by the claims.

Overview

Methods for the integration and/or formation of airgaps in a semiconductor device are described. Such methods may be used to produce a semiconductor device including a stack of layers, where the stack of layers includes at least one sub-stack of layers.

In one embodiment of a semiconductor device produced by such a method, the sub-stack of layers includes a liner layer made of a liner material and a sacrificial layer made of a sacrificial layer material. The liner layer, which is formed of silicon-carbide (SiC), is converted locally into the sacrificial material (e.g., to $SiO2$). In this particular device, the chemically changed part of the liner layer has in-plane dimensions smaller than 1 μm, smaller than 500 nm, or smaller than 100 nm. It will be appreciated that in-plane dimensions of smaller than 10 nm are achievable.

For this device, the liner material is resistant to a first etching substance. The first etching substance may be hydrofluoric acid (HF) in a diluted solution. Alternatively, HF may be used in a vapor form as vapor HF (VHF). Other substances may be used for the first etching substance in place of HF or VHF. The particular substance used depends, in part, on the materials being used to produce the semiconductor device.

In cases where the first etching substance is an HF diluted solution, an anhydrous HF solution may be used instead of an aqueous HF solution (HF/H2O mixture). Use of an anhydrous solution may provide for improved control of the etch process. For example, HF/alcohol (e.g., methanol) mixtures may be used.

The first etching substance is reactive with the sacrificial layer material, such that the first etch substance etches (removes) the sacrificial layer material. In a typical embodiment, the sacrificial layer is a dielectric layer that is situated under a liner layer. The liner layer on top of the sacrificial layer functions as a hardmask layer. A second liner layer, in the sub-stack of layers, may be situated under said sacrificial layer to act as etch stop layer. The liner layers (under and on top of the sacrificial layer) may be formed from silicon carbide (SiC).

A method for the integration of airgaps (e.g., in a semiconductor device) includes etching a hole in a stack of layers (such as the sub-stack of layers described above) with a second etching substance (e.g., an anisotropic dry plasma), such as during "end of line" processing of the semiconductor device (e.g., during interconnect formation). The second etching substance may be an oxidizing substance, such as a dry etch plasma that contains oxygen.

The second etching substance is also used to chemically alter the properties of the liner layer locally, such that part of the liner layer is converted locally and becomes etchable by the first etching substance (e.g., is converted to the same material (or a highly similar material) as the sacrificial layer material). The process of locally chemically altering the liner layer may also result in the removal of the chemically altered portion of the liner layer, thus forming a plug-hole in the liner layer. Alternatively, a separate operation may be used to remove the portion of the liner layer that has been locally chemically altered.

The method further includes forming a line made from a conductive material embedded in the hole. The conductive line may be separated from the sacrificial layer by a barrier layer that is resistant to the first etching substance, which may be the line or, if present, the barrier layer. The conductive material may be selected from a group of materials including metals, carbon nanotubes and conductive polymers. For example, the conductive material may be Cu, Au or Ag. However, it will be appreciated that other conductive materials may also be used.

In this method, the filling of the holes leads to the creation of conductive lines. These conductive lines are formed as part of a (single or dual) damascene structure in a semiconductor device. The dual damascene structure is made of horizontal lines (also referred to as "trenches") and vertical structures (referred to as "vias"). Single and dual damascene structures are formed during so-called "end of line" (EOL) semiconductor processing.

The method then includes applying the first etching substance to the stack of layers to create airgaps around the conductive line. Such airgaps may be formed preferably near the damascene trenches and/or near the vias. In situations where the conducting material of the conductive line is not resistant to the first etching substance and a barrier layer is present, an additional step of depositing a protective layer on the exposed part of the line is employed before the first etching substance is applied.

While the production of airgaps is generally described herein in the context of electrical isolation, it will be appreciated that airgaps may also be created using the methods described herein for other purposes. For instance, airgaps may be formed during the production of a microelectromechanical systems (MEMS) device. In such an application, the airgap may be integrated in the MEMS device as a structural or functional element.

Semiconductor Devices with Integrated Airgaps

Figure 1B:
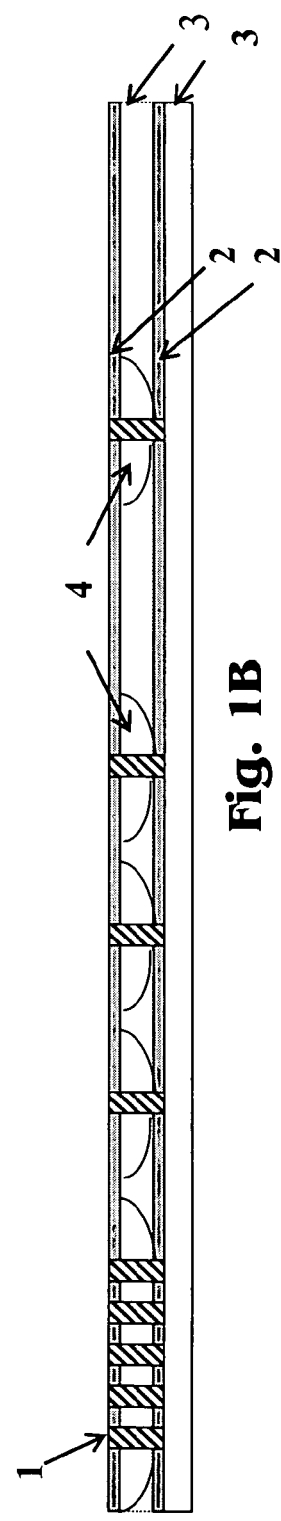

FIGS. 1A and 1B are cross-sectional drawings that illustrate a single damascene (SD) stack before (FIG. 1A) and after (FIG. 1B) etch of a sacrificial layer (e.g., the upper insulator or dielectric layer 3) to form airgaps 4 between narrowly spaced interconnects 1. The interconnects 1 may be formed from any number of conductive materials, such as metals (e.g., Cu, Au, Ag, etc.) and are embedded in a stack of dielectric layers 3, which also includes liner layers 2. The dielectric layers 3 and the liner layers 2 are deposited on a Si or other substrate (not shown) using any number of possible methods, such as Plasma Enhanced Chemical Vapor Deposition (PECVD), Chemical Vapor Deposition (CVD), spin-on deposition etc. The dielectric layer 3 may be $SiO_2$ (k=4.2) or, alternatively, another Si containing insulator material with a lower k value, such as SiOC:H materials (e.g., carbon doped oxides, commonly referred to as silicon oxy-carbides). The liner layers 2 may be formed of a carbon containing Si compound such as SiC or SiC:H, among other possible materials.

As may be seen in FIG. 1B, the airgaps 4 are selectively incorporated into the upper dielectric layer 3 adjacent to the interconnects 1. The liner layer 2 that is situated on top of the upper dielectric layer 3 (the sacrificial layer) acts as a hardmask layer. The interconnects 1 may also be further separated from the sacrificial dielectric layer 3 by a barrier layer (not shown). This barrier layer may be formed as a Ta/Ta(N) layer. Further, the barrier layer may function as diffusion barrier for the etching substance (e.g., HF) used to form the airgaps 4.

In this embodiment, the hardmask liner layer 2 (e.g., SiC) is deposited on top of the upper (sacrificial) dielectric layer 3. The hardmask liner layer 2 is resistant to etching agents that are used to remove the sacrificial layer material (e.g., HF or VHF) and the hardmask liner layer 2 is non-conductive. Local conversion of the liner is performed before the creation of the interconnects 1. Such local conversion is achievable on a nanometer scale. The local conversion generates vulnerable spots (plugs) in the hardmask liner layer 2. Such localized conversion of the SiC liner layer may be accomplished using an oxygen containing plasma to locally convert the SiC into $SiO_2$. The plugs (when removed to form plug-holes) act as channels for chemical diffusion of the interconnects 1. As previously described, a barrier layer may also be deposited.

The overburden of the deposited metal (conductive material) and the overburden of the barrier material are removed and planarized using known techniques, such as Chemical Mechanical Polishing (CMP). An etching agent is then applied to dissolve the sacrificial material between the narrowly spaced conductive lines (e.g., the interconnects 1).

FIGS. 2A–2E are cross-sectional drawings that illustrate a first embodiment of a manufacturing sequence for producing a semiconductor device with selectively integrated airgaps and a device stack produced by that method. In FIG. 2A, a damascene stack after resist coating and deep ultra violet (DUV) patterning is shown. An exposed resist layer 5 shows the patterning performed by the DUV process. The damascene stack shown in FIG. 2A is the starting point for producing a semiconductor device stack with integrated airgaps.

A dry etch step is used to form vias and trenches, as is shown in FIG. 2B. The dry etch step takes place in an $O_2$ containing plasma and leads to local oxidation of the upper liner layer 2. The dry etch sequence starts with an oxygen/fluorocarbon plasma with a high oxygen content, which opens the hardmask liner layer 2. Then a less oxygen rich plasma is applied (e.g., with a higher amount of fluorocarbon) to create an opening in the upper dielectric layer 3 (which is formed of $SiO_2$). The dry etch process is anisotropic, which means that lateral etching is negligible compared to the vertical etching. The anisotropic etch process is performed until the lower liner layer 2 situated under the upper dielectric layer 3 (also referred to as the sacrificial layer) is reached. The lower liner layer 2 situated under the sacrificial dielectric layer 3 acts as an etch stop layer. Both the upper and lower liner layers 2 (hardmask and etch stop layer) may be formed from SiC. During the dry etching process, a part of the hardmask layer (e.g. SiC), situated at the sidewall of the opening, is oxidized to $SiO_2$ due to the oxygen rich plasma. The dimensions of the converted part of the SiC hardmask liner layer 2 is in the nanometer range, such as 100 nm or smaller. The dry etching process is stopped once the lower liner layer 2 (acting as the etch stop) is reached to prevent conversion to $SiO_2$ by the oxygen containing plasma.

FIG. 2C shows the stack of FIG. 2B after barrier layer deposition using a Ta/TaN 10/15 nm layer (not specifically shown), Cu seed layer deposition (100 nm), Cu electroplating (1 μm) and chemical mechanical polishing (CMP) (which forms an interconnect/metal line 1).

Materials that may be used to form a barrier layer are TaN, Ta, TiN, Ti, WN or WCN, etc. Further, any number of techniques may be used to form such a barrier layer. These techniques include Physical Vapor Deposition (PVD), Metal Organic Chemical Vapor Deposition (MO-CVD), Atomic Layer Deposition (ALD), Plasma Enhanced Chemical Vapor Deposition (PECVD), Chemical Vapor Deposition (CVD), and spin-on deposition. Furthermore, such a barrier layer may prevent diffusion of conductive material into the dielectric material (e.g., the low-k material).

FIG. 2D illustrates the stack (device) after dielectric etching to form the airgaps 4 has been performed using, for instance, vapor HF (VHF) (or any other compound for etching the dielectric). The flow of the HF or VHF is indicated in FIG. 2D by the arrows 8. The HF exposure generates the airgaps 4 near the dielectric layer/barrier layer interface. Even though the lateral depth of SiC to $SiO_2$ conversion during the dry etch process is in the nanometer range, this depth is sufficient to allow diffusion of HF molecules to reach the underlying $SiO_2$ layer. The fact that, for this embodiment, a Ta(N)/SiC barrier is present, the dissolution of $SiO_2$ laying between narrowly spaced Cu lines is accelerated as compared to using bare $SiO_2$ (existing between largely spaced Cu lines) without a barrier layer. The resulting stack is mechanically and chemically stable and allows for further processing, such as depicted in FIG. 2E. Specifically, FIG. 2E illustrates a third liner layer 2 and third dielectric layer 3 formed on top of the hard mask liner layer 2 and the interconnect 1. Alternatively, only the liner layer 2 or the dielectric layer 3 may be formed on top of the structure illustrated in FIG. 2D. The additional layers in FIG. 2E (the top liner layer 2 and the top dielectric layer 3) are thick conformal layers, which may be deposited using CVD.

FIGS. 3A–3E are cross-sectional drawings that illustrate a second embodiment of a manufacturing sequence for producing a semiconductor device with selectively integrated airgaps and a device stack produced by that method. As in the first embodiment, the starting point is a single or dual damascene stack after resist coating and deep ultra violet (DUV) patterning, such as illustrated in FIG. 3A. It is noted that the stack illustrated in FIG. 3A differs from the stack shown in FIG. 2A in that an HF resistant basis layer 9 (e.g., chemically deposited SiOC) is used under the Cu lines/vias 1, as compared to the lower dielectric layer 3 in FIG. 2A. The basis layer 9 is resistant to the etching substance (e.g., the dry etch plasma) used to form the interconnect lines and/or vias 1. Thus, the etching of the hole in the stack of layers where the conductive line is formed is downward limited (stopped) by the basis layer 9.

The basis layer 9 may also be resistant to the etching substance used to form the airgaps, so as to limit the creation of airgaps under the metal (Cu) lines and/or vias 1. The basis layer 9 may thus be a metal structure. In this situation, both the dielectric layer 3 and basis layer 9 may be formed of SiCO:H material, where the basis layer 9 contains higher carbon content to make it more resistant to HF than the dielectric layer 3. In such embodiments, the basis layer 9 may alternatively be formed from a non silicon containing material, such as a low-k spin-on material.

The dry etch step takes place in an $O_2$ containing plasma. As is illustrated in FIG. 2B, this dry etch step results in the local oxidation 7 of the liner layers 2 above and below the dielectric layer 3. As just discussed, the use of the basis layer 9 prevents the formation of airgaps under the metal line/via 1.

FIG. 3C illustrates the stack of FIG. 3B after barrier layer deposition (e.g., a Ta/TaN layer of 10/15 nm), Cu seed layer deposition (100 nm), Cu electroplating (1 μm) and chemical mechanical polishing (CMP), which forms the interconnect/via 1. FIG. 3D illustrates the stack of FIG. 3C after VHF exposure (indicated by the arrows 8), which generates the airgaps 4 near the $SiO_2$/TaN interface. Note that the basis layer 9 is not etched by HF, which confines the airgaps 4 to a single level of the stack.

In the situation where the basis layer 9 is not resistant to HF, the etch process to form the airgaps may be a timed etch operation. In such an approach, the HF exposure (etch) would be stopped once the lower liner layer 2 is reached to prevent the HF from attacking the basis layer 9.

FIG. 3E illustrates the stack of FIG. 3D after a thick conformal CVD layer upper layers 2 and 3) (e.g., $SiC/SiO_2$ CVD) has been deposited. The resulting stack is mechanically and chemically stable to allow further processing as depicted in FIG. 3E. Note that no airgap is generated underneath the Cu lines providing for better mechanical stability of the stack.

FIGS. 4A–4F and FIG. 5A–5F illustrate two additional embodiments of manufacturing sequences for producing a device stack with selectively integrated airgaps and device stacks produced using those methods. The embodiment illustrated in FIGS. 4A–4F and FIGS. 5A–5F differ, in one respect, from the embodiment illustrated in FIGS. 3A–3E in the fact that an additional SiC layer 22 is deposited after etching the hole in the $SiO_2$ material (e.g., using a dry plasma etch). After deposition of the additional SiC layer 22, the bottom of the SiC layer 22 is opened by etching (with dry plasma). Then a barrier layer (e.g., a Ta/TaN layer of 10/15 nm) and a Cu seed layer (100 nm) are deposited prior to Cu electroplating (1 μm) and chemical mechanical polishing (CMP) to form the metal line/via 1.

The embodiments illustrated in FIGS. 4A–4F and FIGS. 5A–5F differ in the fact that the basis layer 9 has an additional metal structure 1 embedded therein in the embodiment of FIGS. 5A–5F. The additional metal structure 1 is used to make contact with the conductive line created in the hole etched in sacrificial layer 3.

Figure 4A:
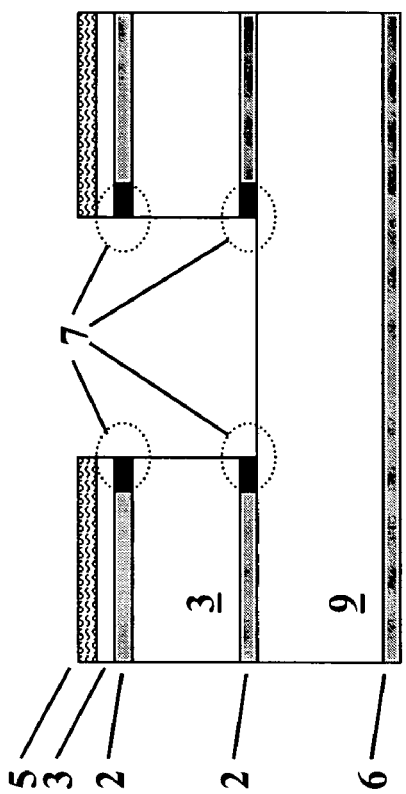
Figure 4B:
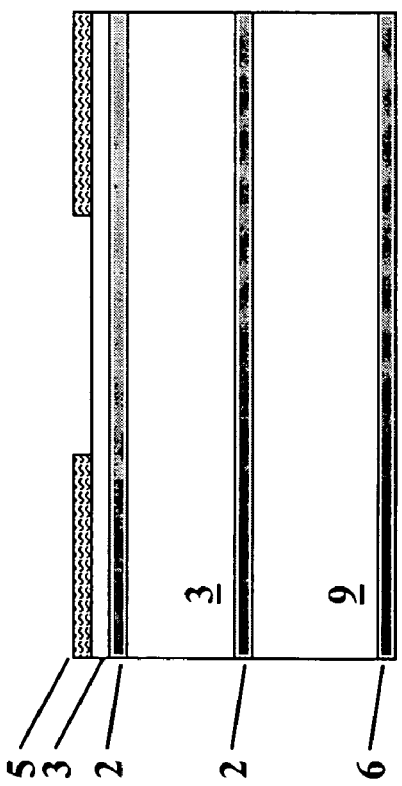
Figure 4C:
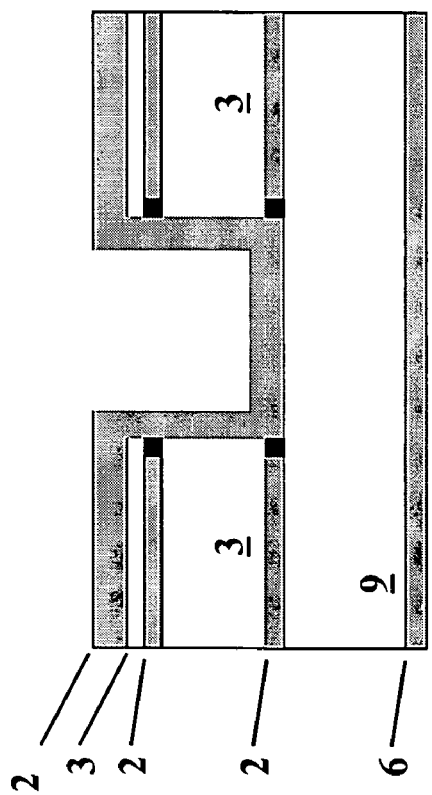
Figure 5A:
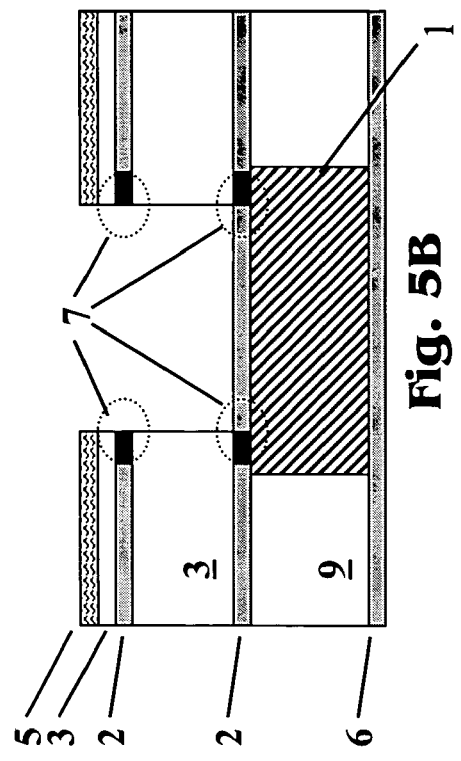
Figure 5B:
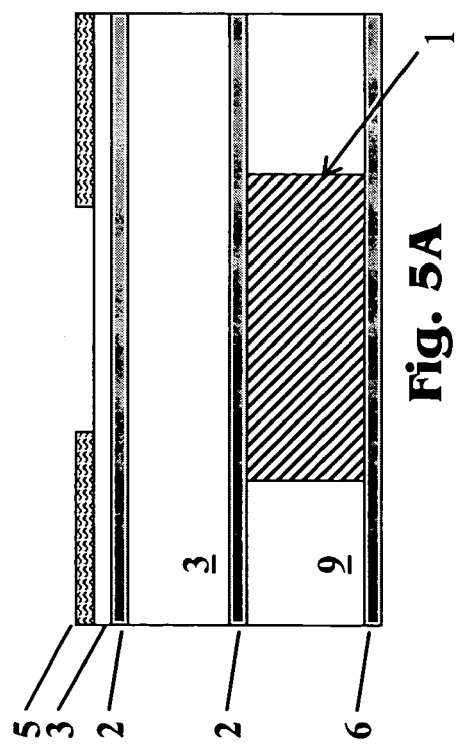
Figure 5C:
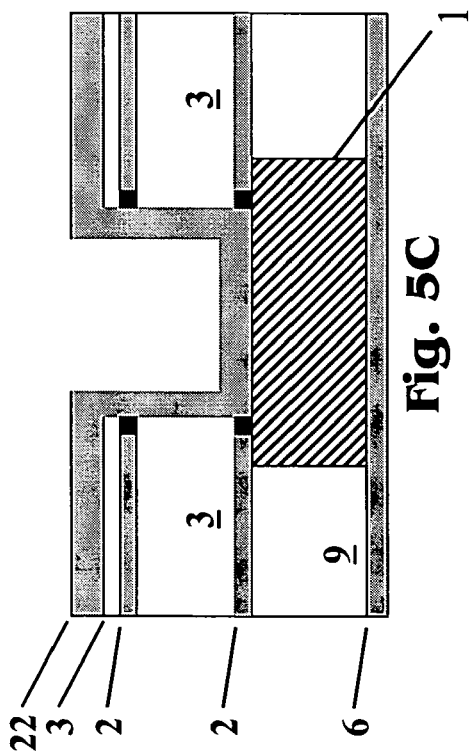

For the embodiments illustrated in FIGS. 4A–4F and FIGS. 5A–5F, the starting point for the stacks is a single or dual damascene stack as illustrated in FIGS. 4A/5A. A dry etch step takes place in an $O_2$ plasma, which generates plugs of local oxidation 7 at the SiC/Ta(N) interface (as shown in FIGS. 4B/5B). After a resist strip to remove the patterned resist layer 5, an additional conformal CVD SiC liner layer 22 of approximately 50 nm is deposited, as is illustrated in FIG. 4C, which covers the entire exposed surface of the stack shown in FIG. 4B. An isotropic $O_2$ plasma treatment is then applied in order to open the bottom of the SiC layer 22, as is illustrated in FIGS. 4D/5D. As may be seen in FIG. 4D, etching of the hole is stopped at the basis layer 9. In comparison, as may be seen in FIG. 5D, etching of the hole is stopped by the metal structure 1 embedded in the basis layer 9.

HF (or VHF) diffuses (as indicated by the arrows 8) through the local oxidation plugs 7 into the $SiO_2$ dielectric material layer 3 to form airgaps 4, without contacting the Cu line 1, which is surrounded on its vertical sides with the SiC layer 22, as may be seen in FIGS. 4E/5E. The Cu line 1 may be formed in the same fashion as was described above with respect to FIGS. 2C and 3C.

FIGS. 4F and 5F illustrate the respective stacks of FIGS. 4E and 5E after a thick conformal CVD layer (e.g., a $SiC/SiO_2$ CVD layer) has been deposited on top of the airgaps 4. The resulting stack is mechanically and chemically stable, so as to be able to withstand the further processing illustrated in FIG. 4F.

For the embodiments described above, one consideration is control of the size of the airgaps 4 that are formed as a result of HF exposure. One factor that affects the size of the airgaps 4 is the duration of the dry plasma etch that locally changes the properties of the liner layers, and affects the lateral depth of oxidation into the liner layers 2. However, the duration of the application of the etching substance (e.g., HF of VHF) to create the airgaps 4 has a more direct affect on the size of the airgaps 4. That is, the size of the airgaps 4 is somewhat independent of the lateral depth of the liner layers 2 that is chemically and/or mechanically changed. Thus, the size of the airgaps 4 may be well controlled by modifying the duration of time that the etching substance for forming the airgaps 4 is applied to the stack of layers.

The distance between neighboring conductor lines is determined by the limitations of available techniques for forming neighboring holes in stack of layers, such as the approaches discussed above. For example, metal lines may be spaced at about 1 µm. The embodiments described above are relatively scaling invariant and are not limited to use for any particular distance between conductor (metal) lines, as chemically and/or mechanically changing the properties of the liner layers locally may be achieved on a nanometer or smaller scale.

EMPIRICAL EXAMPLES

Example 1

A 200 mm wafer that included a single-damascene (SD) stack (such as illustrated in FIGS. 2A–2E) with a 600 nm $SiO_2$ layer on a 50 nm SiC liner layer that was formed on top of a 500 nm $SiO_2$ that, in turn, was supported on a 50 nm $Si_3N_4$ adhesion layer 6 on a 100 silicon substrate (not shown) was studied. After lithography, the stack was dry etched until opening of the SiC hardmask liner layer 2, as illustrated in FIG. 2B and discussed above, was accomplished. A 25 nm Ta(N) diffusion barrier (10 nm Ta(N), 15 nm Ta) and a 100 nm Cu seed layer were deposited by self ionized plasma (SIP). The trenches were filled using Cu electroplating (as illustrated in FIG. 2C) and the remaining (overburden) material was removed by CMP (as illustrated in FIG. 2D).

Organosilicon trimethylsilane gas and He at a pressure of ca. 8 Torr were employed as precursors for a-SiC:H (amorphous hydrogenated SiC). For $SiO_2$, $SiH_4$ and $N_2O$ at 2.6 Torr served as precursors. The main mechanical characteristic of a-SiC:H (also referred to as BLOK or barrier low-k) is a +40 to 300 MPa stress. The dry etch was performed according to the following conditions: Pressure: 175 and 70 mTorr for a double step $SiO_2$ etch, and 90 mTorr for a SiC etch.

The temperature of a wafer chuck employed was set at 20 degrees C.; with the wafer temperature during the dry etch sequence can ramping up to 70–80 degrees C. depending on the process specifications and duration The etch species used were as follows: $SiO_2$ was etched in a 2-step sequence including a main etch using Ar, $O_2$, $CF_4$ and $CHF_3$ (low $SiO_2/SiC$ selectivity) and an overetch using Ar, $C_4F_8$, $O_2$. SiC was etched with a plasma composed of Ar, $N_2$, $CF_4$, and CHF3. The etch times were determined based on the desired feature size and depth. Typically it takes approximately 60 s to etch a 250 nm wide trench to a depth of 600 nm (using the $SiO_2$ main etch step).

The strip was done in two steps (i) dry strip which employed vapor H2O and (ii) wet strip. Additionally, the samples underwent a well controlled $SiO_2$ etch using a clean room compatible 49% HF solution. The amount of $SiO_2$ etched was controlled with the etch time and etch temperature.

Figure 8:
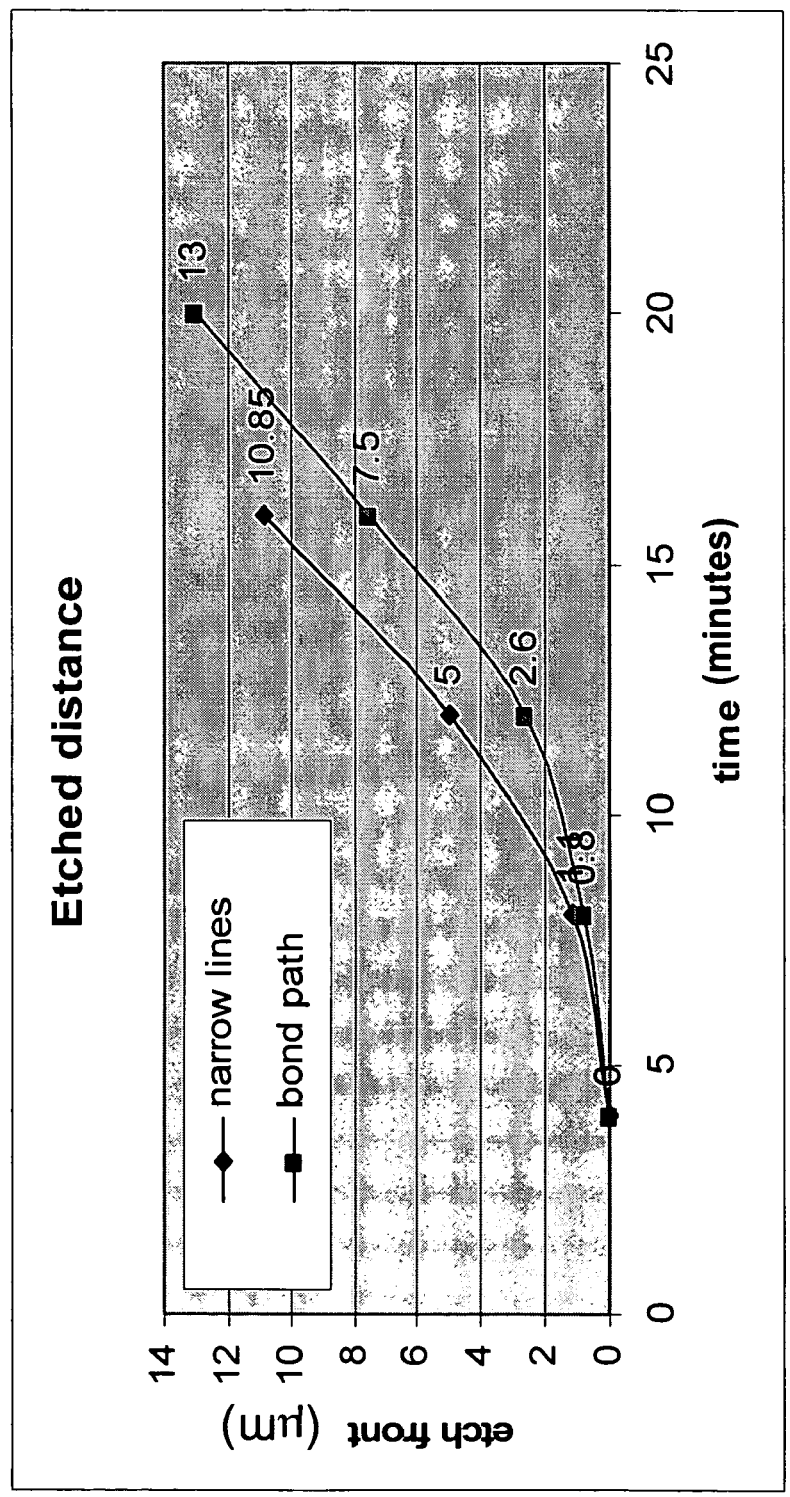
FIG. 8 is a graph showing the etched distance (half of actual groove in x-direction) vs. time dependence of narrow lines and bond paths.
Figure 9:
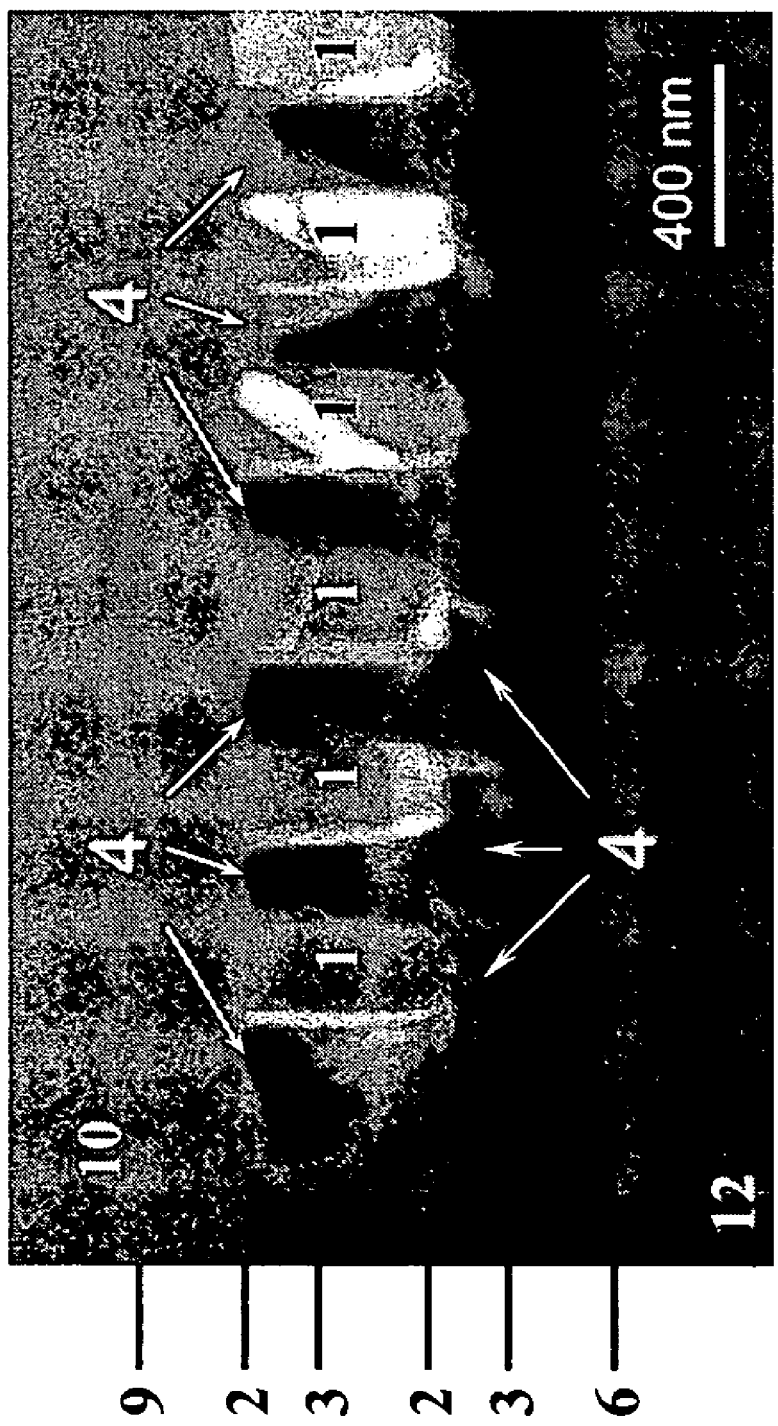
FIG. 9 is an image illustrating an SD stack after an arbitrary VHF exposure time leading to the incorporation of an airgap underneath a Cu line showing channels of HF diffusion.

FIG. 8 is a graph illustrating etch rate vs. VHF exposure, while FIG. 9 is an image that shows the resulting incorporated airgaps 4. Further, FIG. 9 is an image of a cross-sectioned SD stack after VHF exposure.

Example 2

Figure 11A:
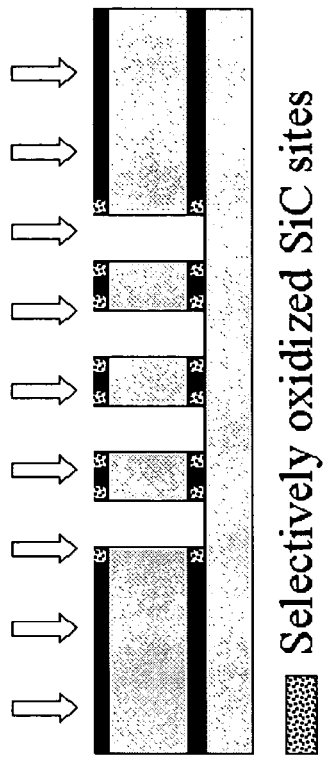
FIGS. 11A–11D are drawings illustrating a process flow for airgap formation.
Figure 11B:
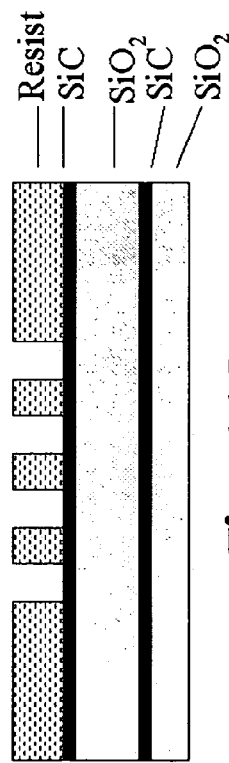
Figure 11C:
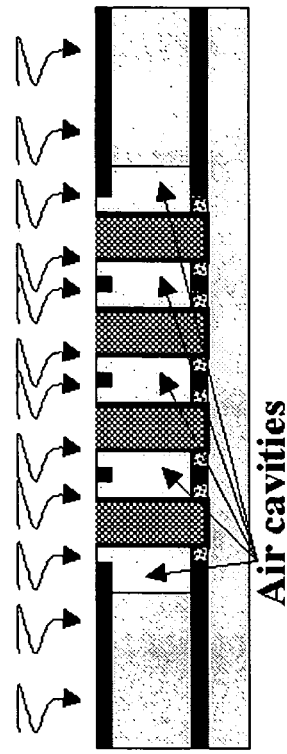
Figure 11D:
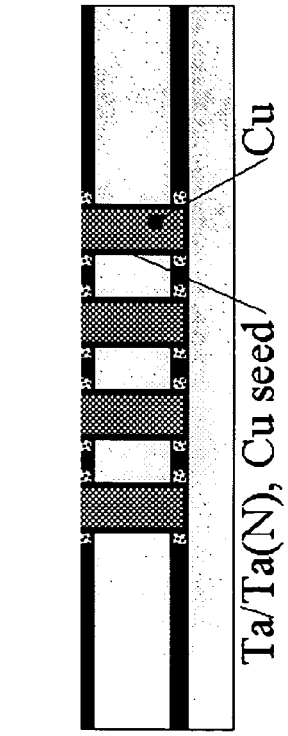

Another process flow for integrating airgaps is illustrated in FIGS. 11A–11D. The structure illustrated in FIGS. 11A–11D includes a stack composed of a 50/500/50/600/50 nm $Si_3N_4/SiO_2/SiC/SiO_2/SiC$ stack that was formed on a 100 silicon wafer by plasma enhanced chemical vapor deposition (PE-CVD). Patterning was achieved using 248 nm wavelength optical lithography, as illustrated in FIG. 11A. A reactive ion etch (RIE) was carried out in an $Ar/N_2/O_2/CF_4/C_4F_8$ mixture at 70 mTorr. A controlled resist strip was used to induce local SiC oxidation 7 at the sidewalls by using a $H_2O$ (v)/$CF_4$ gas mixture at 1100 mTorr, as illustrated by FIG. 11B. Then a 15/10 nm Ta/Ta(N) diffusion block layer and a 100 nm Cu seed layer were formed using ionized physical vapor deposition (i-PVD). Trenches were filled using copper electroplating and the overburden material was removed by CMP, as illustrated by FIG. 11C. The wafer was then cut into 2 cm² dice. The dice were then exposed to an HF/Methanol gas phase mixture ($HF_{(g)}$) by means of a MEMS-CET system (Primaxx, Pa., U.S.A.) at low pressure. $HF_{(g)}$ dissolved the locally oxidized SiC and diffused through the Ta(N)/SiC interface, which resulted in the dissolution of the underlying $SiO_2$ layer, and the formation the airgaps as depicted in FIG. 11D. The amount of etched $SiO_2$ was mainly controlled by varying the $HF_{(g)}$ exposure time. Gas temperature and pressure were also employed to finely tune the etch rate.

Figure 12:
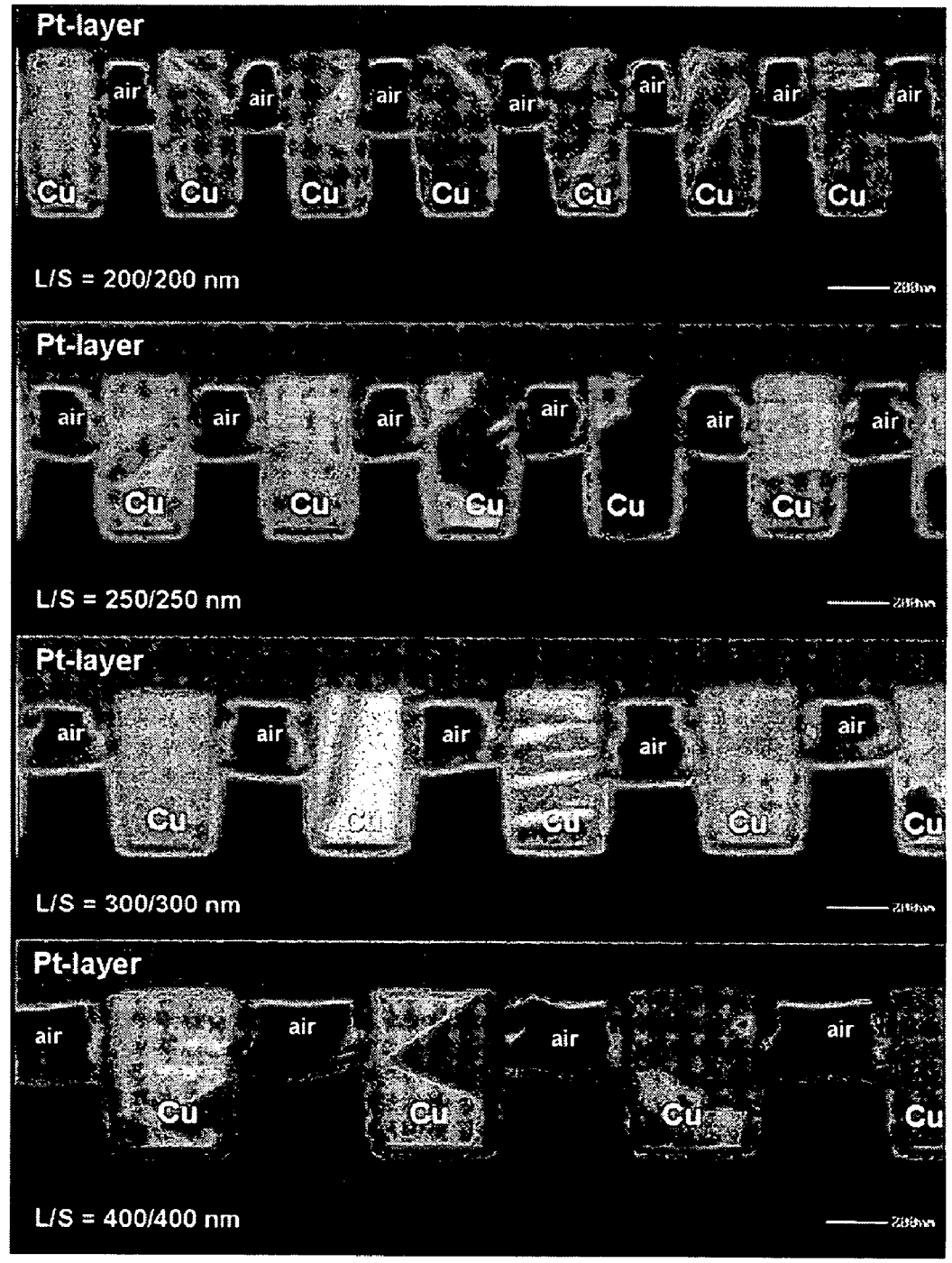
FIG. 12 is cross-sectional images illustrating structures with various interline spacings and airgaps between lines.

FIG. 12 shows cross-sectional images of meander-fork structures. The airgaps in this structure appear to be formed as a result of an isotropic dissolution of the $SiO_2$ dielectric material, as no dominant etching direction is observed. Under the experimental conditions employed, $SiO_2$ etch seems to be very selective, thus avoiding attack of the Ta/Ta(N) barrier by the etch species. In addition, the top SiC layer remains in place even after a Pt layer is FIB deposited on top before imaging.

Example 3

Capacitance was measured between 1–2 cm long meanders and forks (such as illustrated in FIG. 12) with nominal line width/spacing (L/S) between 200/200 and 400/400 nm.

Measurements were made using an HP4284A LCR meter at 100 kHz assuming a parallel RC model for the impedance. The experimental data for this example is reported in Table 2.

TABLE 2

Capacitance (pF) data vs. etch time for samples after etching with HF.

| L/S (micron) | HF etch time (minutes) | | | | | | | | |
|---|---|---|---|---|---|---|---|---|---|
| | 3<br>1-3 | 4<br>1-4 | 5<br>1-5 | 6<br>1-6 | 6<br>1-6-2 | 5<br>2-5 | 6<br>2-6 | 7<br>2-7 | 8<br>2-8 |
| 0.2/0.2 | 6.8 | 6.52 | // | 6 | // | 6.58 | 6.63 | 5.83 | 5.34 |
| | 6.74 | 6.5 | // | 6.06 | 3.06 | 6.32 | 6.67 | 5.81 | 5.34 |
| | 6.76 | 6.52 | // | 6.05 | 6.01 | // | 6.68 | 5.82 | 5.35 |
| | 6.75 | 6.62 | 5.88 | 6.07 | 6.05 | 6.84 | 6.76 | 5.81 | 5.38 |
| | 6.78 | // | // | 6 | // | 6.82 | 6.69 | 5.79 | 5.36 |
| | // | 6.59 | 5.82 | 5.86 | 5.86 | 6.97 | 6.69 | 5.79 | 5.35 |
| average | 6.766 | 6.55 | 5.85 | 6.01 | 5.97 | 6.71 | 6.69 | 5.81 | 5.35 |
| 0.25/0.25 | 4.06 | 3.98 | 3.34 | 3.51 | // | 3.99 | 4.07 | 3.67 | 3.28 |
| | 4.02 | 3.96 | // | 3.5 | // | 3.95 | 4.07 | 3.66 | 3.27 |
| | 4.01 | 3.97 | // | 3.48 | 3.5 | 3.91 | 4.06 | 3.69 | 3.27 |
| | 4.08 | 4.03 | // | 3.54 | // | 3.94 | 4.09 | 3.73 | 3.26 |
| | 4.04 | 4.02 | // | 3.53 | // | 3.95 | 4.07 | 3.68 | 3.26 |
| | 4.03 | 4.01 | // | 3.53 | // | 3.96 | 4.06 | 3.7 | 3.27 |
| average | 4.04 | 4.00 | 3.34 | 3.52 | 3.50 | 3.95 | 4.07 | 3.69 | 3.27 |
| 0.3/0.3 | 2.68 | 2.69 | // | 2.36 | 2.36 | 2.63 | 2.74 | 2.53 | 2.18 |
| | 2.67 | 2.68 | // | 2.35 | // | 2.73 | 2.73 | 2.53 | 2.18 |
| | 2.66 | 2.68 | // | 2.35 | 2.34 | 2.73 | 2.72 | 2.53 | 2.18 |
| | 2.69 | 2.74 | // | 2.4 | 2.39 | 2.66 | 2.75 | 2.59 | 2.2 |
| | 2.7 | 2.73 | // | 2.4 | 2.38 | 2.68 | 2.76 | 2.6 | 2.21 |
| | 2.7 | 2.73 | // | 2.41 | 2.38 | 2.97 | 2.77 | 2.58 | 2.21 |
| average | 2.68 | 2.71 | | 2.38 | 2.37 | 2.73 | 2.75 | 2.56 | 2.19 |
| 0.4/0.4 | 1.49 | 1.5 | 1.21 | 1.29 | // | 1.48 | 1.53 | 1.42 | 1.19 |
| | 1.49 | 1.49 | 1.21 | 1.28 | // | 1.46 | 1.53 | 1.42 | 1.19 |
| | 1.49 | 1.49 | 1.21 | 1.28 | // | 1.45 | 1.53 | 1.42 | 1.19 |
| | 1.54 | 1.51 | 1.23 | 1.31 | // | 1.49 | 1.57 | 1.47 | 1.18 |
| | 1.51 | 1.5 | 1.22 | 1.3 | // | 1.47 | 1.54 | 1.46 | 1.18 |
| | 1.5 | 1.5 | 1.21 | 1.3 | // | 1.47 | 1.54 | 1.45 | 1.18 |
| average | 1.50 | 1.51 | 1.22 | 1.29 | // | 1.47 | 1.54 | 1.44 | 1.19 |

//: no data available

Example 4

Figure 13:
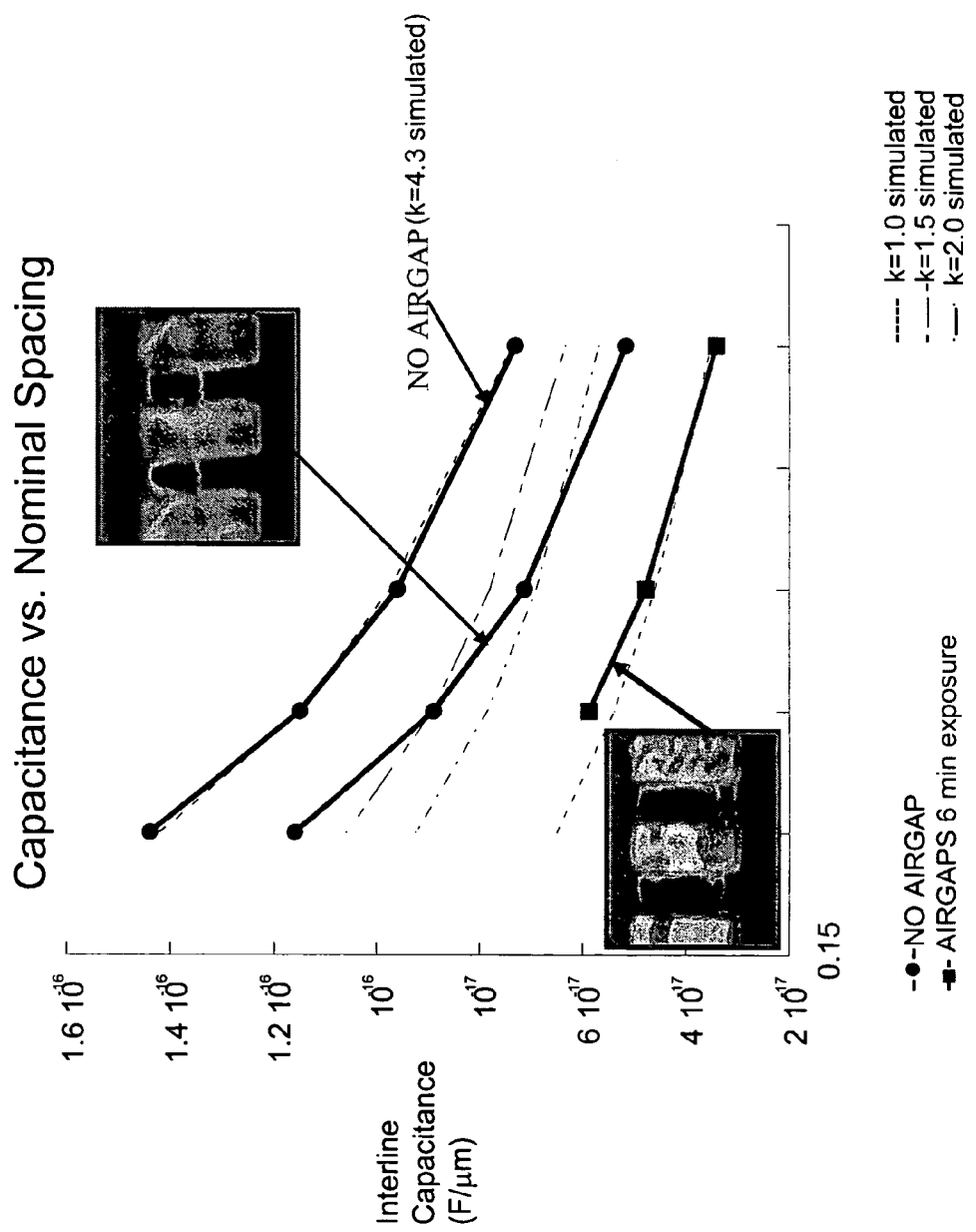
FIG. 13 is a graph illustrating interline capacitance versus nominal spacing after airgap formation for two different HF exposure times compared to samples without airgap formation.

FIG. 13 is a graph illustrating the interline capacitance performance for two sets of experiments (i) dice with "full size" airgaps and (ii) dice with half size airgaps. Half size airgaps correspond to air cavities equal to half the height of the copper line. As shown in FIG. 13, samples with full airgaps showed lower capacitance. However, samples with half size airgaps appeared to be much more stable than samples with full airgaps between the copper lines. The etch time (HF exposure time) was not the only factor to determine the size of the airgaps. Also, the temperature and pressure of the chamber (different for the two sets of experiments) was relevant in determining the size of the airgaps.

Figure 14:
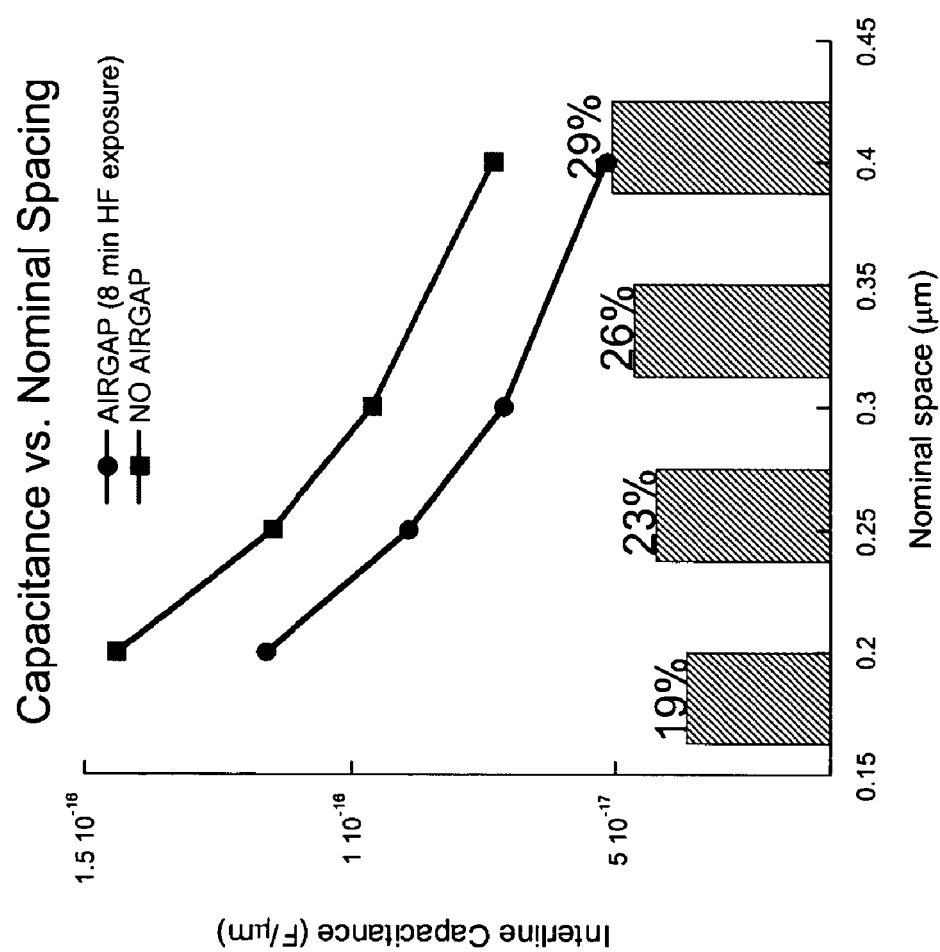
FIG. 14 is a graph illustrating interline capacitance versus nominal spacing for samples with and without airgaps.

FIG. 14 is a graph illustrating interline capacitance versus nominal spacing for samples with and without airgaps. Bars represent the capacitance drop due to airgaps. The drop in capacitance appears to be dependent on the spacing between two adjacent copper lines. This difference is the result of the wider spaces accommodating larger air cavities than smaller line spacings.

Example 5

A cross-sectional TEM image of a SD stack is shown in FIGS. 6A–6C. The SD stack is shown at low magnification in FIG. 6A and at high magnification in FIG. 6B. The right side of the sample shown in FIG. 6A corresponds to the thinnest part of a wedge, as evidenced by its lighter contrast. The spherical profile of the SiC layer in the vicinity of the SiC/Ta(N) interface visible by TEM and supported by EFTEM suggest that this layer has been locally converted to $SiO_2$, thus decreasing its contact area with the Ta(N) barrier wall. This $SiC/SiO_2$ conversion results from the oxygen containing plasma employed during the dry etch step, as was previously discussed. Elements 10 and 11 are, respectively, protective platinum and glass layers. Element 12 is a Si substrate. FIG. 6C illustrates C 13, Cu 14 and O 15 EFTEM mappings of the area surrounded by the white dotted square in FIG. 6A. Note that in EFTEM analysis, light zones refer to high element concentrations. The white dotted circles denote locally converted SiC regions (plugs).

Example 6

Figure 7A:
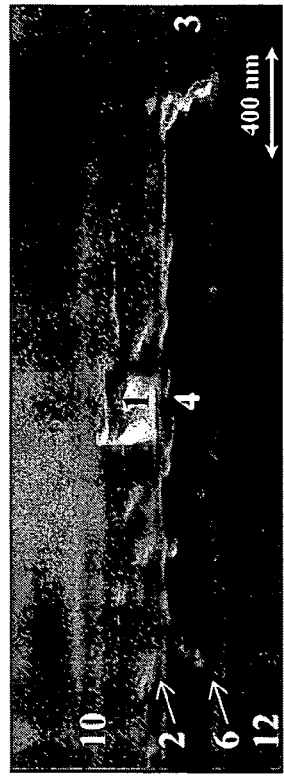
FIGS. 7A–7D are cross-sectional images of a standard Cu—$SiO_2$ single damascene stack after vapor HF (VHF) exposure, where
Figure 7C:
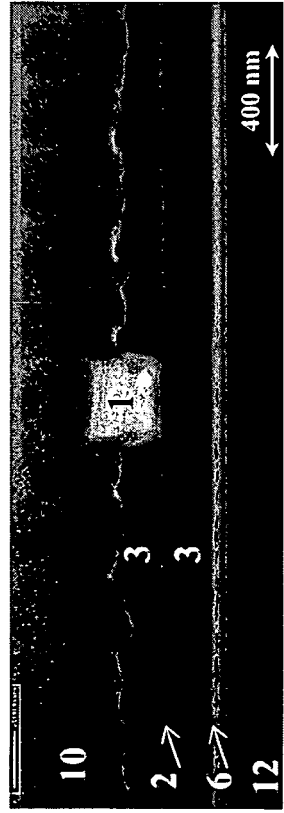
Figure 7B:
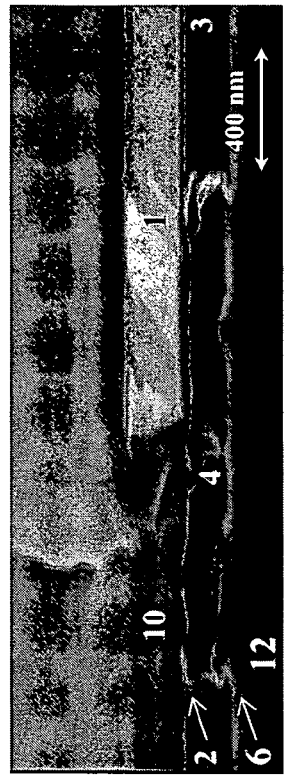
Figure 7D:
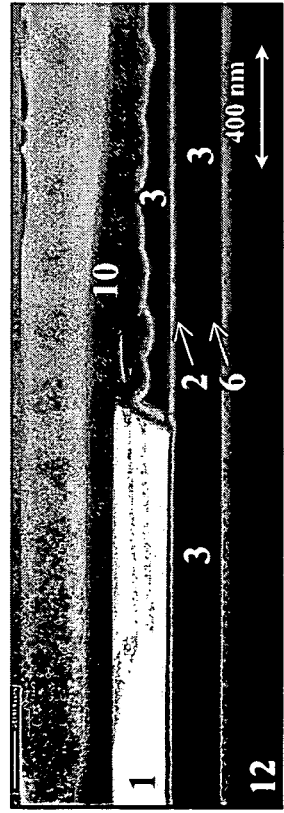

FIGS. 7A and 7C show Focused Ion Beam (FIB) cross-sectional images of an isolated Cu line as the surrounding $SiO_2$ is gradually dissolved due to VHF exposure. Half of the upper $SiO_2$ layer is removed after 4 minutes of etch, as illustrated in FIG. 7A. As the HF exposure continues, the underlying $SiO_2$ film is progressively removed underneath the SiC/Ta(N) interface, which results in the incorporation of air under the metal structure. The afore-mentioned phenomenon proved to take place selectively for $SiO_2$ material lying beneath any SiC/Ta(N) interface. After prolonged HF etch times (more than 8 minutes) the stack modification can be easily monitored by optical inspection as may be seen in FIGS. 7B and 7D. FIGS. 7A and 7B illustrate a narrow line (low area), while FIGS. 7C and 7D illustrate a bondpad (large area). The x-direction is indicated below FIGS. 7C and 7D.

FIG. 9 is an image illustrating an SD stack, such as those described above, after an arbitrary VHF exposure time, where the exposure leads to the incorporation of airgaps between narrowly spaced (300 mm) lines. FIG. 9 illustrates that deposition of new layers on top of the airgap structure is possible. Specifically shown is a SiC (50 nm)—$SiO_2$ (300 nm)—$Si_3N_4$ (500 nm) layer. Moreover, this shows that sacrificial layers, hardmask layers and if appropriate, basis layers may be formed on top of the airgap structure, allowing embodiments of the methods described herein to be repeated.

Figure 10:
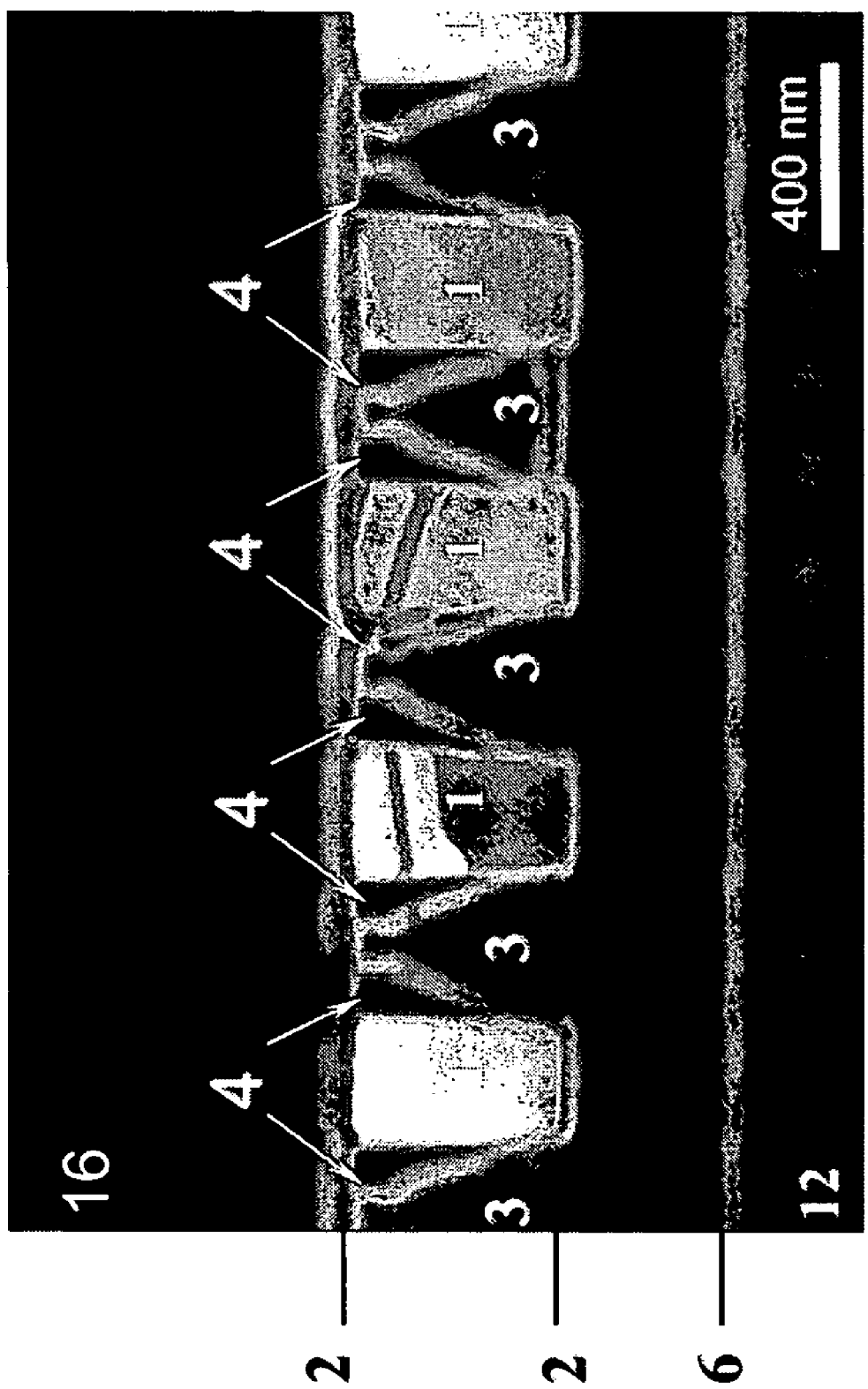
FIG. 10 is an image illustrating an SD stack after an arbitrary VHF exposure time leading to the incorporation of airgaps between narrowly spaced (300 mm) lines.

FIG. 10 is an image illustrating an SD stack after an arbitrary VHF exposure time leading to the incorporation of airgaps between narrowly spaced (300 mm) lines.

Conclusion

Various arrangements and embodiments have been described herein. It will be appreciated, however, that those skilled in the art will understand that changes and modifications may be made to these arrangements and embodiments without departing from the true scope and spirit of the present invention, which is defined by the following claims.

The invention claimed is:
1. A method for the production of airgaps in a semiconductor device, said semiconductor device comprising a stack of layers, said stack of layers comprising at least one iteration of a sub-stack of layers, said sub-stack of layers comprising:
   a liner layer made of liner material; and
   a sacrificial layer made of sacrificial layer material under said liner layer, wherein:
said liner material is resistant to a first etching substance; and
said first etching substance is able to etch said sacrificial layer material;
said method comprising the steps of:
a) etching a hole in said stack of layers with a second etching substance;
b) at least one of chemically changing and mechanically changing the properties of said liner layers locally, wherein part of said liner layers is converted locally and becomes etchable by said first etching substance,
c) creating in said hole a line made of a conductive material, optionally separated from said sacrificial layer by a barrier layer, said line or, if present, said barrier layer being resistant to said first etching substance; and
d) applying said first etching substance to said stack of layers, such that airgaps are created around said line.

2. The method according to claim 1, wherein step (c) comprises the steps of:
i. optionally depositing a barrier layer;
ii. depositing on top of said barrier layer a layer of electrically conductive material; and
iii. applying a subtractive technique on top of said stack of layers, such that at least one embedded line is created.

3. The method according to claim 1, wherein a protective layer is deposited on the exposed part of said line before step (d) is performed.

4. The method according to claim 1, wherein said conductive material is selected from the group of metals, carbon nanotubes, and conducting polymers.

5. The method according to claim 1, wherein said conductive material is Cu, Au or Ag.

6. The method according to claim 1, wherein said stack of layers further comprises a basis layer.

7. The method according to claim 1, wherein the steps of etching a hole in said stack of layers and at least one of chemically changing and mechanically changing the properties of said liner layers locally are performed at the same time.

8. The method according to claim 1, wherein said liner layer material is converted locally into said sacrificial layer material.

9. The method according to claim 1, wherein said converted part of said liner layer material has in-plane dimensions smaller than 1 μm.

10. The method according to claim 9, wherein said converted part of said liner layer material has in-plane dimensions smaller than 500 nm.

11. The method according to claim 10, wherein said converted part of said liner layer material has in-plane dimensions smaller than 100 nm.

12. The method according to claim 11 wherein said converted part of said liner layer material has in-plane dimensions smaller than 10 nm.

13. The method according to claim 1, wherein said stack of layers is a single or dual damascene stack.

14. The method according to claim 6, wherein said basis layer is resistant to said second etching substance.

15. The method according to claim 6, wherein said basis layer is resistant to said first etching substance.

16. The method according to claim 1, wherein said sacrificial layer material comprises silicon dioxide ($SiO_2$).

17. The method according to claim 1, wherein said liner layer material comprises silicon carbide (SiC).

18. The method according to claim 1, wherein said second etching substance comprises $O_2$.

19. The method according to claim 1, wherein said first etching substance comprises hydrofluoric acid (HF).

20. The method according to claim 1, wherein said hole is formed during end of line processing.

21. The method according to claim 6, wherein said basis layer comprises an embedded metal line.

22. The method according to claim 21, wherein said embedded metal line and said line of conductive material form an electrical contact.

23. A method for the production of airgaps in a semiconductor device, the method comprising repeating, at least one time, the steps of:
i. applying a method according to claim 1 on a stack of layers as described in claim 1; and
ii. creating a next stack of layers as described in claim 1 on top of an airgap structure resulting from step (i).

* * * * *